June 9, 1964 R. L. TRENT 3,136,932

MATCHED SEAL HEADER

Filed Oct. 23, 1959

INVENTOR

Robert L. Trent

BY Stevens, Davis, Miller & Mosher

ATTORNEYS

United States Patent Office 3,136,932 Patented June 9, 1964

3,136,932
MATCHED SEAL HEADER

Robert L. Trent, Dallas, Tex., assignor to Texas Instruments Incorporated, Dallas, Tex., a corporation of Delaware Filed Oct. 23, 1959, Ser. No. 848,356
11 Claims. (Cl. 317—234)

This invention relates generally to improvements in semiconductor devices and specifically the invention relates to an improved header design for use in fabrication of transistor devices of the PN junction type.

The deleterious effects on transistors operated at high temperatures has emphasized the need for efficient and effective heat dissipation to increase the power handling capabilities of the device. It has been found, for example, in the use of germanium, one type of semiconductor material used for transistors, that the temperature of the transistor junction should not exceed about 80–100 degrees C. under operating conditions. Thus, a relatively low temperature differential must be maintained between the transistor junction and the outside ambient.

Heretofore, one solution of the heat dissipation problem has been to encase the semiconductor element in a metallic container filled with oil, grease, or mixtures of various desiccants and oil or other liquids to provide good thermal conduction. This arrangement has generally proved unsatisfactory for the reason that the heat dissipation afforded is usually inadequate and perhaps more important, the liquids often detrimentally affect the surface states of the semiconductor crystals.

An alternate solution to the problem of thermal dissipation of the transistor has been to connect heat radiators to the crystal so as to establish a good thermal path from the crystal to a large radiating surface whereby the heat generated in the operation of the device may be dissipated to the outside ambient. These devices have been satisfactory in many instances, particularly where the power requirement of the transistor is not high. The transistor device of the present invention is of this general type, but a number of advantages have been realized through the incorporation of an improved header design which provides for an efficient thermal path for conduction of heat from the transistor junction to the encapsulating can which may have a heat sink attached thereto.

Another problem encountered in transistor fabrication is that of maintaining chemical cleanliness of the crystal and its environment. Transistor action is extremely sensitive to crystal surface conditions and reliability may be considerably affected by undesirable chemical impurities in that vicinity. In bonding operations and, in fact, in all fabrication steps in manufacturing a well-designed transistor, great care must be exercised to avoid contamination and entrapment of impurities.

It is a principal object of the device to provide an improved transistor header design embodying the use of clad materials to provide a path of high thermal conductivity between the junction and can via the base electrode and header.

It is a further object of the present invention to avoid impurity entrapment in part by providing an improved header structure for mounting a transistor in which a novel tab portion is provided constructed integrally with the header as opposed to the use of a separate tab intended to be welded or brazed to the header.

Another object is to provide a novel header for use in mounting a transistor element, which header allows the temperature differential between the transistor junction and the outside ambient to be minimized, thus providing the transistor element with a higher power handling capability than it would otherwise have.

A further object is to provide a clad material header which combines the advantage of a Kovar-to-glass seal in those portions of the header where a glass-to-metal seal is necessary, with the advantage of a high thermal conductivity material used to provide a thermal path between the transistor junction and can.

Another object is to provide an improved header which is readily adaptable to mass fabrication techniques in forming transistors.

Another object of this invention is to provide an improved header, whose clad construction is such as to determine the amount of heat which it will conduct away from the semiconductor unit so that thermal dissipation may be achieved in accordance with power handling requirements. This characteristic of the present device is achieved without altering the physical configuration of the header by adjustment of the proportion of clad materials utilized.

Another object is to provide a header which can be manufactured at low cost and which is constructed with a view to minimizing parts handling in the process of assembling the transistor.

A further object is to provide a clad header design including an outer layer of a chemically and etch resistant material.

Another object is to provide a header which exhibits good heat flow patterns from element to can and thus increases the efficiency of heat conduction to external conducting and radiating surfaces.

Other and further objects of the present invention will become more fully apparent from the following detailed description when taken in conjunction with the drawings in which.

Figure 1:
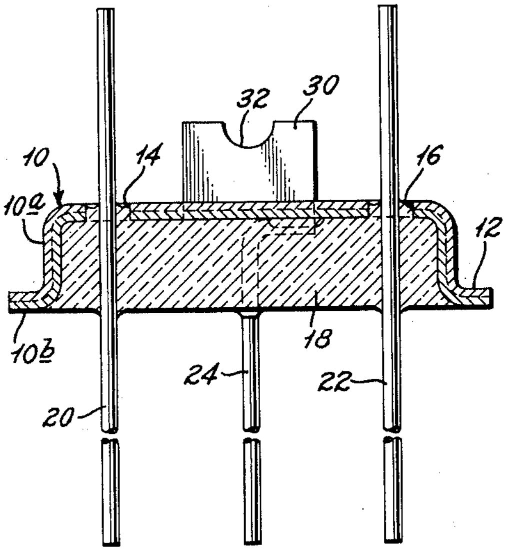
FIGURE 1 is a vertical sectional view of the improved header design.
Figure 2:
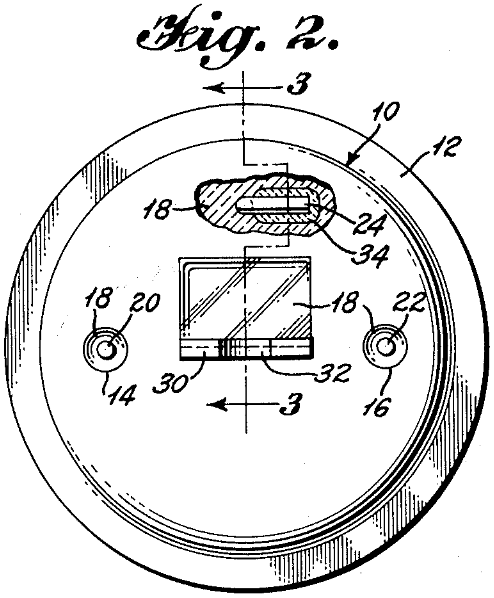
FIGURE 2 is a plan view of the header of FIGURE 1.

Referring now to FIGURE 1, the header assembly includes a dish-shaped metal shell 10 defining circular apertures 14 and 16 and having an out-turned annular flange 12. The space within the shell 10 is filled with a suitable insulating material 18 such as glass which also extends into and fills the circular apertures 14 and 16. Electrical lead wires, 20 and 22, extend through the insulating material 18 and through the apertures 14 and 16 in shell 10. The insulating material 18 forms bushings for the leads as they pass through apertures 14 and 16 and the leads are thereby insulated from electrical contact with the shell 10.

Figure 3:
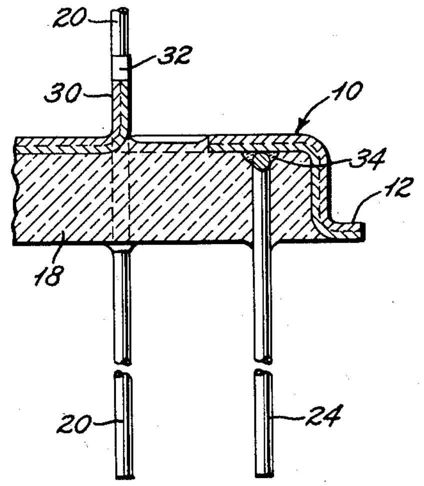
FIGURE 3 is a detail in section showing the connection between one of the electrical leads and the metallic portion of the header.

A third electrical lead 24 passes into the insulating material 18 and is soldered or welded to the inside of the shell 10 as best shown in FIGURE 3.

Integral with the metal shell 10 and projecting upwardly therefrom is a tab 30. The tab 30 is preferably punched and bent from the metal shell 10 and may be cut-out along its upper edge as shown at 32 to facilitate mounting of the semi-conductor crystal.

Metal shell 10 is of clad construction and thus consists of an inner layer 10*b* which is a metal having thermal expansion properties similar to that of the insulating material 18 and an outer layer 10*c* which is a metal of high thermal conductivity. A clad metal construction which has been found especially suitable is a shell in which the inner layer is Kovar, an alloy of iron, nickel and cobalt produced commercially by the Driver-Harris Company of Harrison, N.J., and the outer layer is copper. Kovar is used quite extensively for glass-to-metal seals due to its coefficient of thermal expansion which matches that of certain types of glass compounds.

The matched seal header fabricated of clad metal which is the subject of the invention affords many advantages and improvements over existing header types. Perhaps the most obvious of these advantages is the possibility of obtaining a matched seal between the insulating material 18 and the shell 10 while simultaneously providing an excellent thermal path between transistor element and the can in which it is encased via the shell 10.

As will be appreciated by those skilled in the art, the seals around the external electrical leads and also between the metal shell and insulating material are of major significance in the maintenance of the internal environment of the device because they determine the leak rate into and out of the device. As has already been stated, Kovar-to-glass seals have proven to be excellent for this purpose. Thus, by making the inner layer 10*b* of metallic shell 10 and the electrical leads of Kovar or some other material having thermal expansion properties which match closely those of the insulating material utilized a very excellent seal is obtained.

In order to provide a good thermal path from the crystal junction to the can or heat sink, a metal having a high thermal conductivity can most advantageously be used in the construction of the metal shell 10. The thermal conductivity of copper defined as calories transmitted per second through a plate one centimeter thick across an area of one square centimeter for a temperature difference of 1 degree C. is 0.918 as compared to 0.046 for Kovar. Thus, for example, by using copper as the outer layer 10*a* clad on an inner layer 10*b* of Kovar, a header which possesses excellent heat dissipation characteristics as well as providing tight and rugged seals around the external leads may be fabricated.

This clad construction is also quite significant in that varying heat dissipation requirements can be met by varying the proportionate thickness of the inner and outer metallic layer of the shell 10 without changing the over-all thickness of the shell or its physical configuration. This presents a very real advantage in designing to meet industrial specifications covering the allowable internal temperature differential (junction to case). For a given allowable internal temperature differential, the proportions of the thickness of the outer layer metal to the thickness of the inner layer metal which must be utilized may be easily determined by known analytical techniques. The only variation in design which is required to meet different internal temperature differential requirements within device design limitations, is the relative thickness of the two metal layers 10*a* and 10*b*. The over-all thickness of the metal shell need not be varied. A practical upper limit on the proportion of the thicknesses of the outer and inner metal layers would be set by the allowable deformation of the shell with temperature changes to preclude damage to the metal-to-glass seals.

A further advantage of the new matched seal header accrues from the integral tab feature. Tab 30 is formed by punching it out of the metal shell 10 and bending it into an upright position. It is thus not necessary to weld or braze a tab element to the metal shell of the header. Because of the accompanying entrapment of impurities and inherent chemical uncleanliness of such welding or brazing operations, the elimination of these operations is highly desirable in transistor fabrication.

Following construction of the novel matched seal header, as thus far described, a suitable finish (i.e., plating with gold or other metals) may be applied to the outer layer 10*a* of the clad material shell to provide adequate protection during processing the device and resistance to the action of chemical or electrolytic etching procedures. Alternatively, an additional clad layer may be provided to provide, in turn, the desired protective properties. Also the leads 20 and 22 may be either tin or gold-plated to provide for soldering to the transistor element in accordance with techniques well known in the art.

It will be appreciated that still greater improvements in reliability are achieved through the use of a clad chemically resistant metal layer covering the copper clad. The use of this upper clad layer is considered to be superior to otherwise coated (and in particular plated) protective metal layers. Plating has the drawback of producing a coating having microscopic voids and inclusion of impurities (plating solution), notably by entrapment. Cladding, on the other hand, avoids these difficulties. A top clad of nickel or gold would serve as a suitable chemically resistant metal layer.

Figure 4:
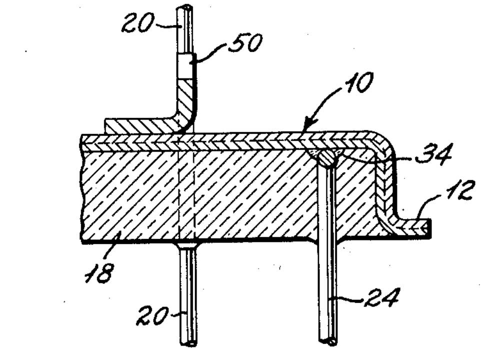
FIGURE 4 is a detail similar to FIGURE 3 showing a variation.
Figure 5:
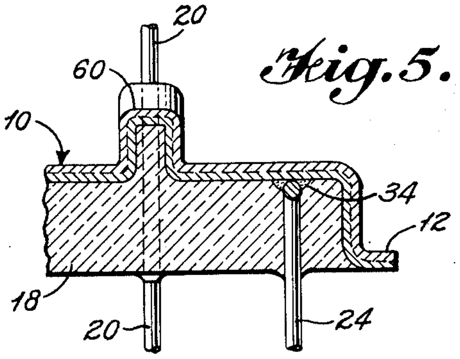
FIGURE 5 is a detail similar to FIGURE 3 showing another variation.

FIGURES 4 and 5 illustrate variations in the header arrangement. In FIGURE 4, the header comprises a copper-Kovar clad 10 having attached to its top surface an L-shaped tab 50. Various metals can be used for tab 50, but it is suggested that a nickel-copper-nickel laminate be used. In FIGURE 5, the header comprises a copper-Kovar clad 10 having a projection 60 coined therein of a configuration similar to tab 50 and tab 30. The variations of FIGURES 4 and 5 may also include an outer clad of a chemically resistant metal layer such as nickel or gold in order to obtain improved reliability. The structure illustrated in FIGURE 5 is particularly advantageous as all surfaces may be covered by a clad layer of chemically resistant material.

Although the arrangement described hereinabove is considered a preferred embodiment of the invention, it will be appreciated that other arrangements are possible which do not depart from the novel concepts herein taught. For example, although reference by way of example has been made to the use of Kovar and copper as materials from which the clad material shell may be fabricated, any two or more metals or alloys may be used in any proportionate thickness so as to impart to the header those properties which are especially desired, or to effect material economies within technical specification requirements.

Thus, various other changes and modifications, such as are obvious to one skilled in the art, are deemed to be within the spirit, scope and contemplation of the present invention.

What is claimed is:

1. A header unit for a transistor device comprising a dish-shaped metal shell, insulating dielectric material enclosed within said shell, a pair of lead wires passing through said insulating material and said shell, a third lead wire passing through said insulating material and connected to said shell, and a metallic tab integral with said shell and projecting upward therefrom to form one electrode for the wafer of said transistor device, said dish-shaped metal shell having apertures in one surface thereof through which said pair of lead wires pass and having an inner layer of metal having substantially the same coefficient of thermal expansion as said insulating material and an outer layer of metal whose thermal conductivity is higher than that of said inner layer, and further having an etch resistant metallic plating super-imposed upon said outer layer, said insulating material being bonded to said inner layer of said metallic shell and forming insulating bushings in said apertures in said shell through which said pair of lead wires pass.

2. A header unit for a transistor device as claimed in claim 1 in which said insulating material is glass, said inner layer of said metallic shell is Kovar, and said outer layer of said metallic shell is copper.

3. In a semiconductor device, a header unit comprising insulating material, a metallic shell partially surrounding said insulating material and bonded thereto, said metallic shell having a first inner metallic layer which possesses substantially the same coefficient of thermal expansion as said insulating material bonded to said insulating material, a second inner layer of metal of high thermal conductivity clad to said first inner layer and an outer layer of a metal possessing qualities of chemical resistance, to the action of various electrolytic and chemical etching processes commonly employed in fabrication of semiconductor devices clad to said second inner layer, a plurality of circular apertures in said shell for accommodating the lead wires of said semiconductor device, and lead wires passing through said insulating material and through said circular apertures.

4. A header unit for a semiconductor device as claimed in claim 3 in which said insulating material is glass, said first inner layer of said metallic shell is Kovar, said second inner layer of high thermal conductive layer is copper, and said outer layer of chemically resistant material is nickel.

5. A header unit for a semiconductor device as claimed in claim 4 in which said outer layer of chemically resistant material is gold.

6. A header unit as claimed in claim 3, having a metallic tab integral with said shell and extending upwardly therefrom to provide an electrode.

7. A header unit for a semiconductor device comprising a metal shell, insulating material filling the interior of said shell and being bonded thereto, said insulating material being characterized by having substantially the same coefficient of thermal expansion as said metal shell, a metal electrode integral with said shell and projecting outwardly therefrom to receive the semiconductive device, said shell and said electrode being clad with a metal which is characterized by a thermal conductivity much greater than said metal shell.

8. Apparatus according to claim 7 wherein said shell is composed of an alloy of iron, nickel and cobalt and said shell and electrode are clad with copper.

9. A header unit for a semiconductor device comprising a dish-shaped metal shell, insulating dielectric material having a coefficient of thermal expansion matched with that of said shell substantially filling the interior of said shell and being bonded thereto, at least one aperture in said shell, lead wire means passing through said insulating material and said at least one aperture in said shell, said lead wire means projecting upwardly from said shell to provide electrode means for the semiconductor device, said insulating material extending into said at least one aperture and forming an insulating bushing for said lead wire means, another lead wire passing through said insulating material and being electrically connected to said shell on the interior thereof, a metallic tab integral with said shell and projecting upward therefrom to form an electrode for the semiconductor device, a layer of metal clad to the exterior of said shell having thermal conductivity higher than that of said shell, and an etch resistant metallic plating superimposed upon said layer.

10. A transistor header unit comprising a dish-shaped metal shell, insulating dielectric sealing material having a coefficient of thermal expansion matched with that of said shell substantially filling the interior of said shell and being bonded thereto, a pair of small apertures in said shell, a pair of lead wires passing through said insulating material and said apertures in said shell, said lead wires projecting upwardly from said shell to provide electrodes for the transistor device, said insulating material forming insulating bushings for said lead wires in said apertures, another lead wire passing through said insulating material and electrically connected to said shell, a metal tab integral with said shell and projecting upwardly therefrom to form another electrode for the transistor device, a layer of metal having thermal conductivity much greater than that of said shell clad to the exterior of said shell and to one side of said tab.

11. A header unit for a semiconductor device comprising:

(*a*) a laminated metallic shell, (*b*) insulating material substantially filling the shell, (*c*) the shell including an inner layer of a material which possesses substantially the same coefficient of thermal expansion as the insulating material, the inner layer being bonded to the insulating material, an intermediate layer of copper clad to the inner layer, and a gold plating covering the intermediate layer and constituting the outer surface of the shell, (*d*) the shell defining a plurality of apertures for accommodating the lead wires of a semiconductor device, (*e*) and a plurality of lead wires each passing through a respective aperture and through the insulating material, the lead wires being bonded to the insulating material.

References Cited in the file of this patent

UNITED STATES PATENTS 2,934,588 Ronci ---------------- Apr. 26, 1960
2,947,925 Maynard -------------- Aug. 2, 1960